(12) United States Patent
Oh et al.

(10) Patent No.: US 10,795,263 B2
(45) Date of Patent: Oct. 6, 2020

(54) COMPOSITIONS FOR REMOVING PHOTORESIST

(71) Applicant: SAMSUNG ELECTRONICS CO., LTD., Suwon-si, Gyeonggi-do (KR)

(72) Inventors: Jung-Min Oh, Incheon (KR); Mi-Hyun Park, Seongnam-si (KR); Hyo-San Lee, Hwaseong-si (KR); Ji-Hoon Jeong, Suwon-si (KR); Yong-Sun Ko, Suwon-si (KR); In-Gi Kim, Hwaseong-si (KR); Na-Rim Kim, Daegu (KR); Sang-Tae Kim, Iksan-si (KR); Seong-Min Kim, Iksan-si (KR); Kyong-Ho Lee, Osan-si (KR)

(73) Assignees: SAMSUNG ELECTRONICS CO., LTD., Suwon-si, Gyeonggi-do (KR); DONGWOO FINE-CHEM, Pyeongtaek-si, Gyeonggi-do (KR)

( * ) Notice: Subject to any disclaimer, the term of this patent is extended or adjusted under 35 U.S.C. 154(b) by 195 days.

(21) Appl. No.: 15/986,901

(22) Filed: May 23, 2018

(65) Prior Publication Data

US 2018/0267409 A1 Sep. 20, 2018

Related U.S. Application Data

(62) Division of application No. 15/084,536, filed on Mar. 30, 2016, now Pat. No. 10,025,192.

(30) Foreign Application Priority Data

Apr. 27, 2015 (KR) .......................... 10-2015-0059184

(51) Int. Cl.
| | |
|---|---|
| *G03F 7/42* | (2006.01) |
| *H01L 21/8238* | (2006.01) |
| *H01L 21/266* | (2006.01) |
| *H01L 29/16* | (2006.01) |
| *H01L 21/311* | (2006.01) |
| *G03F 7/039* | (2006.01) |

(52) U.S. Cl.
CPC .............. *G03F 7/426* (2013.01); *G03F 7/039* (2013.01); *G03F 7/42* (2013.01); *G03F 7/422* (2013.01); *G03F 7/425* (2013.01); *H01L 21/266* (2013.01); *H01L 21/31133* (2013.01); *H01L 21/823814* (2013.01); *H01L 21/823828* (2013.01); *H01L 29/16* (2013.01)

(58) Field of Classification Search
CPC ....................................................... G03F 7/426
See application file for complete search history.

(56) References Cited

U.S. PATENT DOCUMENTS

| | | | |
|---|---|---|---|
| 6,713,232 B2 | 3/2004 | Muranaka et al. | |
| 7,129,029 B2 | 10/2006 | Egbe | |
| 7,199,091 B2 | 4/2007 | Takashima | |
| 7,534,753 B2 | 5/2009 | Wu et al. | |
| 7,816,312 B2 | 10/2010 | Oowada et al. | |
| 8,772,214 B2 | 7/2014 | Wu et al. | |
| 2006/0046944 A1 | 3/2006 | Hata et al. | |
| 2006/0255315 A1* | 11/2006 | Yellowaga | C11D 3/2082 252/79.1 |
| 2009/0192065 A1 | 7/2009 | Korzenski et al. | |
| 2010/0112728 A1 | 5/2010 | Korzenski et al. | |
| 2010/0127338 A1 | 5/2010 | Kim | |
| 2011/0021400 A1* | 1/2011 | Mizuta | G03F 7/425 510/176 |
| 2013/0296214 A1 | 11/2013 | Barnes et al. | |
| 2014/0024191 A1 | 1/2014 | Chen et al. | |

FOREIGN PATENT DOCUMENTS

| | | |
|---|---|---|
| JP | 2013-145375 A | 7/2013 |
| KR | 10-2012-0036030 A | 4/2012 |

* cited by examiner

*Primary Examiner* — Kathleen Duda
(74) *Attorney, Agent, or Firm* — Lee IP Law, P.C.

(57) ABSTRACT

A composition for removing photoresist, including an alkyl ammonium fluoride salt in an amount ranging from about 0.5 weight percent to about 10 weight percent, based on a total weight of the composition; an organic sulfonic acid in an amount ranging from about 1 weight percent to about 20 weight percent, based on the total weight of the composition; and a lactone-based solvent in an amount ranging from about 70 weight percent to about 98.5 weight percent, based on the total weight of the composition.

7 Claims, 14 Drawing Sheets

US 10,795,263 B2

COMPOSITIONS FOR REMOVING PHOTORESIST

CROSS-REFERENCE TO RELATED APPLICATIONS

This is a divisional application based on pending application Ser. No. 15/084,536, filed Mar. 30, 2016, the entire contents of which is hereby incorporated by reference.

Korean Patent Application No. 10-2015-0059184, filed on Apr. 27, 2015, in the Korean Intellectual Property Office, and entitled: "Compositions for Removing Photoresist and Methods of Manufacturing Semiconductor Devices Using the Same," is incorporated by reference herein in its entirety.

BACKGROUND

1. Field

Example embodiments relate to compositions for removing photoresist and methods of manufacturing semiconductor devices using the same.

2. Description of the Related Art

In a semiconductor device fabrication, a photo-lithography process may be performed to form various patterns or impurity regions. For example, a photoresist pattern may be formed on a substrate, and an ion-implantation process may be performed using the photoresist pattern as an implantation mask to form the impurity region at an upper portion of the substrate.

After the formation of the impurity region, the photoresist pattern may be removed by an ashing process and/or a strip process for subsequent device processes.

SUMMARY

Embodiments may be realized by providing a composition for removing photoresist, the composition including an alkyl ammonium fluoride salt in an amount ranging from about 0.5 weight percent to about 10 weight percent, based on a total weight of the composition; an organic sulfonic acid in an amount ranging from about 1 weight percent to about 20 weight percent, based on the total weight of the composition; and a lactone-based solvent in an amount ranging from about 70 weight percent to about 98.5 weight percent, based on the total weight of the composition.

The alkyl ammonium fluoride salt may be in an amount ranging from about 1 weight percent to about 6 weight percent, based on the total weight of the composition; the organic sulfonic acid may be in an amount ranging from about 1 weight percent to about 10 weight percent, based on the total weight of the composition; and the lactone-based solvent may be in an amount ranging from about 80 weight percent to about 98 weight percent, based on the total weight of the composition.

The alkyl ammonium fluoride salt may be represented by the following Chemical Formula:

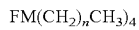   [Chemical Formula]

wherein, in the Chemical Formula, n is an integer between 2 and 10.

The alkyl ammonium fluoride salt may consist essentially of tetra-butyl ammonium fluoride.

The organic sulfonic acid may include one or more of methane sulfonic acid, ethane sulfonic acid, l-propane sulfonic acid, para-toluene sulfonic acid, or benzene sulfonic acid.

The organic sulfonic acid may consist essentially of methane sulfonic acid.

The lactone-based solvent may include one or more of gamma-butyrolactone, gamma-valerolactone, gamma-caprolactone, or gamma-heptalactone.

The lactone-based solvent may include gamma-butyrolactone.

The composition for removing photoresist may be devoid of water and other acidic components except for the organic sulfonic acid.

Embodiments may be realized by providing a method of manufacturing a semiconductor device, the method including forming gate structures on a substrate; forming a first photoresist layer covering the gate structures on the substrate; partially removing the first photoresist layer so that at least one gate structure of the gate structures is exposed; forming an impurity region at an upper portion of the substrate adjacent to the exposed gate structure by an ion-implantation process; and removing a remaining portion of the first photoresist layer using a composition that includes an alkyl ammonium fluoride salt in an amount ranging from about 0.5 weight percent to about 10 weight percent, based on a total weight of the composition, an organic sulfonic acid in an amount ranging from about 1 weight percent to about 20 weight percent, based on the total weight of the composition, and a lactone-based solvent in an amount ranging from about 70 weight percent to about 98.5 weight percent, based on the total weight of the composition.

The substrate may include a first region and a second region, and the gate structures include a first gate structure and a second gate structure formed on the first region and the second region, respectively, and partially removing the first photoresist layer may include exposing the first gate structure.

The method may further include, after removing the remaining portion of the first photoresist layer using the composition, forming a second photoresist layer covering the first gate structure and the second gate structure; partially removing the second photoresist layer so that the second gate structure is exposed; forming an impurity region at an upper portion of the substrate adjacent to the second gate structure by an ion-implantation process; and removing a remaining portion of the second photoresist layer using the composition.

The first region and the second region may be provided as an N-channel metal oxide semiconductor (NMOS) region and a P-channel metal oxide semiconductor (PMOS) region, respectively.

The alkyl ammonium fluoride salt included in the composition may be represented by the following Chemical Formula:

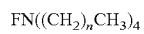   [Chemical Formula]

wherein, in the Chemical Formula, n is an integer between 2 and 10.

The composition may be devoid of water and other acidic components except for the organic sulfonic acid.

The composition may consist essentially of the alkyl ammonium fluoride salt, the organic sulfonic acid, and the lactone-based solvent.

Embodiments may be realized by providing a method of manufacturing a semiconductor device, the method including forming a photoresist layer on a semiconductor substrate; partially removing the photoresist layer to form a photoresist pattern, the photoresist pattern including an opening through which the semiconductor substrate is exposed; performing an ion-implantation process on the semiconductor substrate using the photoresist pattern as an implantation mask; and removing the photoresist pattern using a composition that includes an alkyl ammonium fluoride salt in an amount ranging from about 0.5 weight percent to about 10 weight percent, based on a total weight of the composition, an organic sulfonic acid in an amount ranging from about 1 weight percent to about 20 weight percent, based on the total weight of the composition, and a lactone-based solvent in an amount ranging from about 70 weight percent to about 98.5 weight percent, based on the total weight of the composition.

The method may further include, before forming the photoresist layer on the semiconductor substrate, forming an object layer on the semiconductor substrate.

The method may further include, before performing the ion-implantation process, partially removing the object layer using the photoresist pattern as an etching mask. The object layer may include a silicon oxide layer and a silicon nitride layer.

Embodiments may be realized by providing a method of removing photoresist from a semiconductor substrate, the method including providing a photoresist strip composition, the photoresist strip composition being devoid of water, and removing photoresist from the semiconductor substrate using the photoresist strip composition, the photoresist including a novolac positive-type polymer.

The photoresist strip composition may include tetra-butyl ammonium fluoride, methane sulfonic acid, and one or more of gamma-butyrolactone, gamma-valerolactone, or gamma-caprolactone.

The photoresist strip composition may include about 2 weight percent to about 6 weight percent of the tetra-butyl ammonium fluoride, based on a total weight of the composition, about 2 weight percent to about 6 weight percent of the methane sulfonic acid, based on the total weight of the composition, and about 85 weight percent to about 95 weight percent of the one or more of gamma-butyrolactone, gamma-valerolactone, or gamma-caprolactone, based on the total weight of the composition.

The semiconductor substrate may include a germanium layer.

Removing the photoresist from the semiconductor substrate using the photoresist strip composition may include etching the germanium layer at an etching rate of less than about 5 Å/min.

Removing the photoresist from the semiconductor substrate using the photoresist strip composition may include etching the germanium layer at an etching rate of less than about 1 Å/min.

The photoresist strip composition may include about 4 weight percent of the tetra-butyl ammonium fluoride, based on a total weight of the composition, about 5 weight percent of the methane sulfonic acid, based on the total weight of the and about 91 weight percent of the one or more of gamma-butyrolactone, gamma-valerolactone, or gamma-caprolactone, based on the total weight of the composition.

The germanium layer may be on a silicon wafer.

The photoresist strip composition may be devoid of other acidic components except for the methane sulfonic acid.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
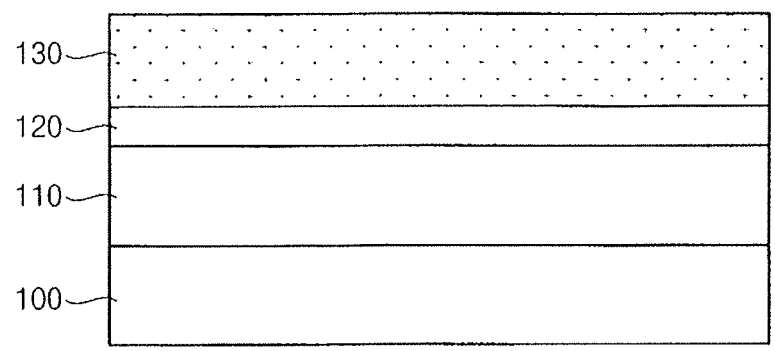
FIGS. 1 to 6 illustrate cross-sectional views of a method of manufacturing a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers, and/or sections, these elements, components, regions, layers, and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Compositions for Removing Photoresist

According to example embodiments, the composition for removing photoresist may include an alkyl ammonium fluoride salt, an organic sulfonic acid, and a lactone-based solvent as an organic solvent. In some embodiments, the composition may consist essentially of the alkyl ammonium fluoride salt, the organic sulfonic acid, and the lactone-based solvent, e.g., the composition may be devoid of water and/or other organic acids.

In some example embodiments, the composition for removing photoresist may be utilized as a strip solution for removing a photoresist pattern used as an ion-implantation mask. For example, the composition for removing photoresist may be utilized for removing the photoresist pattern modified (e.g., cured or transformed) by an ion-implantation process.

The alkyl ammonium fluoride salt may serve as a fluorine-containing active species for removing a photoresist material. The fluorine-containing active species may include, e.g., bifluoride ion ($HF_2^-$) or hydrogen fluoride (HF).

In example embodiments, a tetra-alkyl ammonium fluoride may be used as the alkyl ammonium fluoride salt. As the number of alkyl groups combined with the alkyl ammonium fluoride salt increases, solubility with respect to the lactone-based solvent may be improved, and a non-aqueous organic-based photoresist strip system substantially devoid of water may be realized.

In some embodiments, the alkyl group combined with the tetra-alkyl ammonium fluoride may have a carbon number of at least 3 (at least a C3 alkyl group). For example, tetra-butyl ammonium fluoride may be used as the tetra-alkyl ammonium fluoride. If the alkyl ammonium fluoride salt combined with alkyl groups having a carbon number less than 3 (smaller than the C3 alkyl group) such as tetra-methyl ammonium fluoride is used, the alkyl ammonium fluoride salt may not be fully dissolved in the organic solvent, and a removal efficiency for a polymer residue generated from the cured photoresist material may be reduced.

In some embodiments, the alkyl ammonium fluoride salt may include one or more compounds represented by the following Chemical Formula.

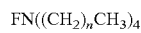  [Chemical Formula]

$$FN((CH_2)_nCH_3)_4$$

In the Chemical Formula, n may be an integer selected between 2 and 10.

An amount of the alkyl ammonium fluoride salt may be adjusted in consideration of a removal efficiency for a photoresist layer and a protection of a lower structure under the photoresist layer.

In example embodiments, the alkyl ammonium fluoride salt may be included in an amount ranging from about 0.5 weight percent (wt %) to about 10 wt % based on a total weight of the composition for removing photoresist. If the amount of the alkyl ammonium fluoride salt is less than about 0.5 wt %, the removal efficiency for the photoresist layer may be reduced. If the amount of the alkyl ammonium fluoride salt exceeds about 10 wt %, the lower structure including, for example, germanium (Ge), silicon (Si), or silicon oxide, may be damaged.

In some embodiments, the alkyl ammonium fluoride salt may be included in an amount ranging from about 1 wt % to about 8 wt % based on a total weight of the composition. In an embodiment, the alkyl ammonium fluoride salt may be included in an amount ranging from about 1 wt % to about 6 wt % based on a total weight of the composition.

The organic sulfonic acid may react with the alkyl ammonium fluoride salt to generate the fluorine-containing active species. Damages of, e.g., damage to, the lower structure may be prevented by the organic sulfonic acid. For example, a thin layer may be formed on a surface or a metal layer through a chelate bond formation by the organic sulfonic acid, and the metal layer may be protected while removing the photoresist layer.

The organic sulfonic acid may serve as a buffer controlling an activity of the fluorine-containing active species. For example, a silicon oxide layer under the photoresist layer may be prevented from being damaged by a strong active species such as HF.

For example, the organic sulfonic acid may include methane sulfonic acid, ethane sulfonic acid, I-propane sulfonic acid, para-toluene sulfonic acid or benzene sulfonic acid. These may be used alone or in a combination thereof.

In some embodiments, the composition for removing photoresist may only include the organic sulfonic acid as an acid-based component, and other types of acid-based compounds may be excluded from the composition.

For example, other organic acids such as, for example, formic acid, acetic acid, acrylic acid, oxalic acid, or succinic acid, may be excluded from the composition, and damages of, e.g., damage to, the lower structure under the photoresist layer may be minimized.

In an embodiment, methane sulfonic acid may be used as the organic sulfonic acid.

In example embodiments, the organic sulfonic acid may be included in an amount ranging from about 1 wt % to about 20 wt % based on the total weight of the composition for removing photoresist. If the amount of the organic sulfonic acid is less than about 1 wt %, the removal efficiency for the photoresist layer may be reduced. If the amount of the organic sulfonic acid exceeds about 20 wt %, the lower structure may be damaged.

In some embodiments, the organic sulfonic acid may be included in an amount ranging from about 1 wt % to about 10 wt % based on the total weight of the composition.

The lactone-based solvent may include a polar solvent that may have a good solubility for the alkyl ammonium fluoride salt and the organic sulfonic acid according to example embodiments.

Examples of the lactone-based solvent may include gamma-butyrolactone, gamma-valerolactone, gamma-caprolactone and gamma-heptalactone. These may be used alone or in a combination thereof. In an embodiment, gamma-butyrolactone may be used as the lactone-based solvent.

The lactone-based solvent such as gamma-butyrolactone may be used, damages of, e.g., damage to, the lower structure may be avoided, and the solubility for the alkyl ammonium fluoride salt and the organic sulfonic acid may be improved.

In example embodiments, the lactone-based solvent may be included as a remainder of the composition except for the alkyl ammonium fluoride salt and the organic sulfonic acid. For example, the lactone-based solvent may be included in an amount ranging from about 70 wt % to about 98.5 wt % based on the total weight of the composition. In some embodiments, the lactone-based solvent may be included in an amount ranging from about 80 wt % to about 98 wt % based on the total weight of the composition As described above, a non-aqueous photoresist strip system substantially devoid of water may be realized by using the composition for removing photoresist in accordance with example embodiments. If water is included in the photoresist strip system, an adsorption site may be created on, e.g., a silicon oxide layer, a silicon nitride layer, or a metal layer to cause the damages of, e.g., damage to, the lower structure.

The composition for removing photoresist according to example embodiments may consist essentially of the alkyl ammonium fluoride salt, the organic sulfonic acid, and the lactone-based solvent, and a photoresist layer or a photoresist pattern cured by an ion-implantation process may be effectively removed while suppressing the damages of, e.g., damage to, the lower structure. Polymer residues from the photoresist layer and the photoresist pattern may be effectively dissolved in the composition, and subsequent semiconductor device processes may be performed without defects from the polymer residues.

In some embodiments, additional agents such as, for example, an anti-corrosion agent or an anti-oxidant, may be further included in the composition to an extent that properties of the composition such as a solubility, a passivation of the lower structure and a photoresist removal efficiency may not be degraded.

Methods of Manufacturing Semiconductor Devices

FIGS. 1 to 6 illustrate cross-sectional views of a method of manufacturing a semiconductor device in accordance with example embodiments.

Referring to FIG. 1, an object layer 110 may be formed on a substrate 100. An anti-reflective layer 120 and a photoresist layer 130 may be sequentially formed on the object layer 110.

The substrate 100 may include a semiconductor substrate such as a silicon substrate, a germanium substrate or a silicon-germanium substrate. A silicon-on-insulator (SOI) substrate or a germanium-on-insulator (GOI) substrate may be also used as the substrate 100. The substrate 100 may include a group III-V compound such as, for example, InP, GaP, GaAs, or GaSb.

The object layer 110 may be a layer that may be partially etched by a photo-lithography process. In example embodiments, the object layer 110 may be converted into a lower insulation layer including, e.g., a plurality of holes or trenches by the photo-lithography process.

In example embodiments, the object layer 110 may be formed of an insulation material such as silicon oxide, silicon nitride, and/or silicon oxynitride. The object layer 110 may be formed by a chemical vapor deposition (CVD) process, a plasma enhanced chemical vapor deposition (PECVD) process, an atomic layer deposition (ALD) process, or a thermal oxidation process on a top surface of the substrate 100.

The anti-reflective layer 120 may prevent or reduce a light reflection while performing an exposure process in the photolithography process. The anti-reflective layer may be formed of an organic resist material. For example, the anti-reflective layer 120 may be formed using a BARC (Bottom of Anti-Reflection Coating) composition by a spin coating process.

A photoresist composition may be coated on the anti-reflective layer 120 by, e.g., a spin coating process, and then a soft-baking process may be performed to form the photoresist layer 130.

The photoresist composition may be prepared by dissolving a photoresist material in an organic solvent. The photoresist composition may further include a photo-acid generator (PAG) or a sensitizer.

The photoresist material may include a positive-type polymer in which a cross-linked bond at an exposed portion may be decomposed, or a protecting group combined with a back-bone chain at the exposed portion may be separated.

The back-bone chain may include a polymer chain such as, for example, novolac, polystyrene, polyhydroxystyrene (PHS), polyacrylate, polymethacrylate, polyvinyl ester, polyvinyl ether, polyolefin, polynorbornene, polyester, polyamide, or polycarbonate.

The protecting group may include, e.g., an acetal group, an ether group, or a thioether group. Examples of the ether protecting group may include a t-butyloxycarbonyl (t-Boc) group. The protecting group may include, e.g., an acetal group, an ether group, or a thioether group. Examples of the ether protecting group may include a t-butyloxycarbonyl (t-Boc) group.

The photoresist material may include a negative-type polymer in which a cross-linked bond may be generated at an exposed portion to cause a curing.

Hereinafter, detailed descriptions are provided using examples in which the positive-type polymer is used as the photoresist material.

Figure 2:
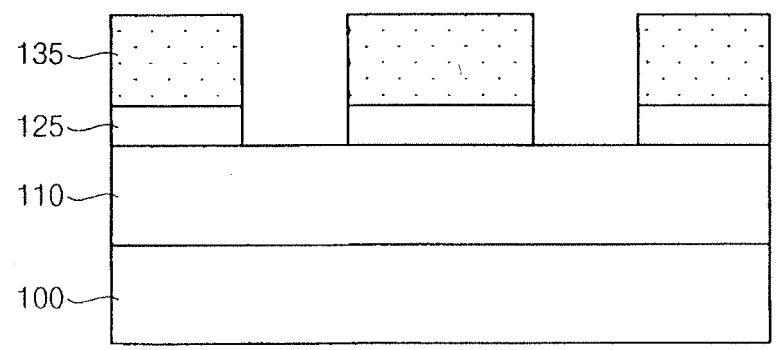

Referring to FIG. 2, the photoresist layer 130 may be converted into a photoresist pattern by performing exposure and developing processes. The anti-reflective layer 120 may be partially removed through the photoresist pattern 135 to form an anti-reflective pattern 125.

For example, an exposure mask including a transmissive portion may be placed on the photoresist layer 130. A light may be irradiated on the photoresist layer 130 through the transmissive portion of the exposure mask such that the photoresist layer may be divided into an exposed portion and a non-exposed portion.

An acid (H⁺) may be generated from the PAG included in the photoresist composition at the exposed portion.

In some embodiments, a post-exposure baking (PEB) process may be further performed after the exposure process. The acid from the PAG may be uniformly distributed in the exposed portion by the PEB process. Accordingly, the protecting group such as the acetal group or the ether group combined with the back-bone chain may be deprotected or separated in the exposed portion, chemical properties of the exposed portion may be modified, and the exposed portion may be selectively removed using, e.g., a hydroxide-based developer solution such as tetra methyl ammonium hydroxide (TMAH).

The non-exposed portion may remain after the developing process to define the photoresist pattern 135. In some embodiments, a hard-baking process may be further performed after the developing process.

If the photoresist material includes the negative-type polymer, the non-exposed portion may be selectively removed by the developing process.

The anti-reflective layer 120 may be partially removed by the developing process together with the exposed portion, or by an additional etching process to form the anti-reflective pattern 125.

In example embodiments, a mask pattern may be defined by the anti-reflective pattern 125 and the photoresist pattern 135. The mask pattern may include a plurality of holes through which a top surface of the object layer 110 may be exposed. In some embodiments, a trench extending linearly and exposing the top surface of the object layer 110 may be formed between the mask patterns neighboring each other.

In some example embodiments, a hard mask layer may be further formed between the anti-reflective layer 120 and the object layer 110. The hard mask layer may be partially etched after the formation of the anti-reflective pattern 125 to form a hard mask pattern, and the mask pattern may include a stacked structure of the hard mask pattern, the anti-reflective pattern 125, and the photoresist pattern 135.

The hard mask layer may be formed of a silicon-based or carbon-based spin-on hardmask (SOH) material.

Figure 3:
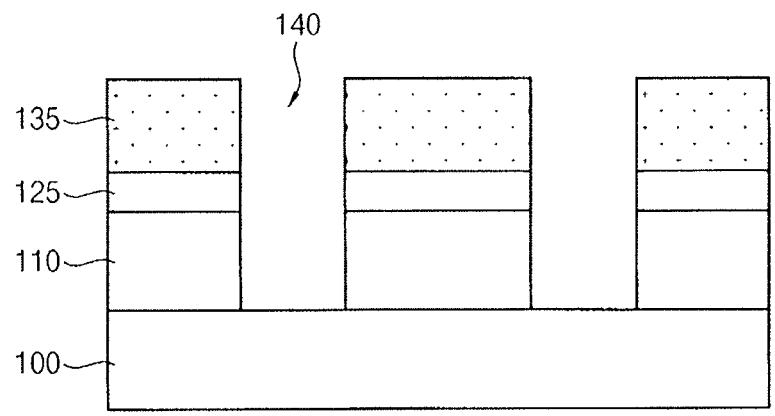

Referring to FIG. 3, the object layer 110 may be partially removed using the mask pattern as an etching mask, and an opening 140 through which the top surface of the substrate 100 may be partially exposed may be formed in the object layer 110. The opening 140 may have a contact hole shape or a trench shape.

Figure 4:
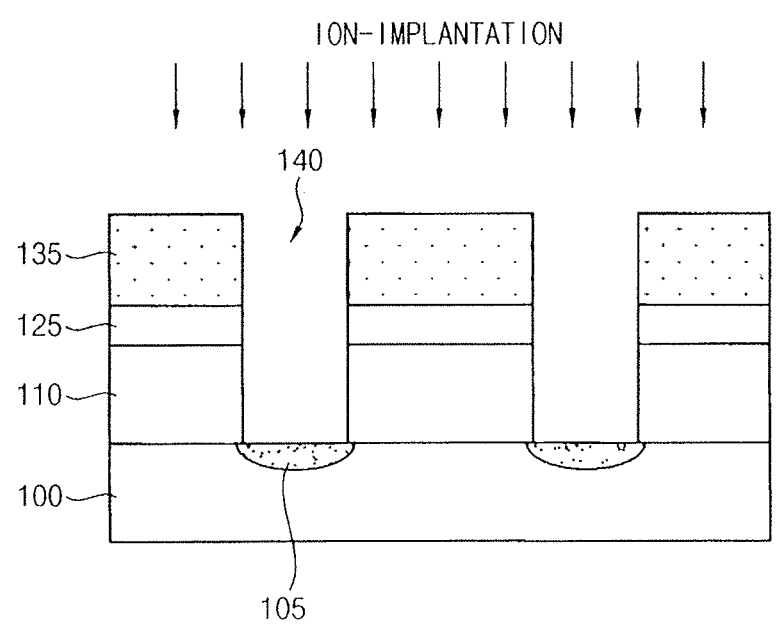

Referring to FIG. 4, an ion-implantation process may be performed through the opening 140. In example embodiments, n-type or p-type impurities may be implanted at an upper portion of the substrate 100 exposed through the mask pattern to form an impurity region 105. The photoresist pattern 135 may serve substantially as an implantation mask.

If the opening 140 has the contact hole shape, the impurity region 105 may have an island shape formed at the upper portion of the substrate 100. If the opening 140 has the trench shape, the impurity region 105 may have a linear shape.

For example, the impurity region 105 may serve as, for example, a source/drain region or a common source line (CSL).

In example embodiments, while performing the ion-implantation process, the n-type or p-type impurities may be accelerated to collide with the photoresist pattern 135, and an upper portion of the photoresist pattern 135 may be partially cured. Polymer residues may be generated from the photoresist pattern 135 due to, for example, a collision with the impurities. For example, the polymer residues may be attached to a sidewall of the opening 140.

Figure 5:
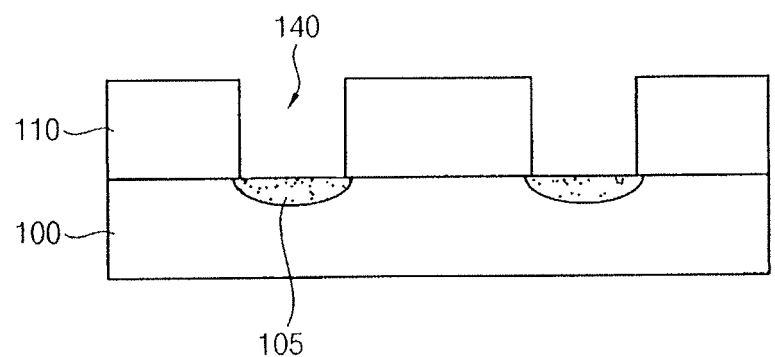

Referring to FIG. 5, the photoresist pattern 135 may be removed by a composition for removing photoresist.

The composition for removing photoresist may be utilized as a photoresist strip solution, and may include an alkyl ammonium fluoride salt, an organic sulfonic acid, and a lactone-based solvent as described above. In some embodiments, the composition for removing photoresist may consist essentially of the alkyl ammonium fluoride salt, the organic sulfonic acid, and the lactone-based solvent.

In example embodiments, the composition for removing photoresist may include the alkyl ammonium fluoride salt in an amount ranging from about 0.5 wt % to about 10 wt %, the organic sulfonic acid in an amount ranging from about 1 wt % to about 20 wt %, and a remainder of the lactone-based solvent (e.g., in an amount ranging from about 70 wt % to about 98.5 wt %), based on a total weight of the composition.

In some embodiments, the composition for removing photoresist may include the alkyl ammonium fluoride salt in an amount ranging from about 1 wt % to about 8 or from about 1 wt % to about 6 wt %, the organic sulfonic acid in an amount ranging from about 1 wt % to about 10 wt %, and a remainder of the lactone-based solvent (e.g., in an amount ranging from about 80 wt % to about 98 wt %), based on the total weight of the composition.

In some embodiments, a compound represented as $FN((CH_2)_nCH_3)_4$ (n is an integer selected between 2 and 10) may be used as the alkyl ammonium fluoride salt. For example, tetra-butyl ammonium fluoride may be used as the alkyl ammonium fluoride salt.

In some embodiments, methane sulfonic acid, ethane sulfonic acid, I-propane sulfonic acid, para-toluene sulfonic acid, and/or benzene sulfonic acid may be used as the organic sulfonic acid.

In some embodiments, gamma-butyrolactone, gamma-valerolactone, gamma-caprolactone or gamma-heptalactone may be used as the lactone-based solvent. These may be used alone or in a combination thereof.

In some embodiments, water and other organic acids such as formic acid or acetic acid may be excluded from the composition for removing photoresist. Accordingly, a substantially non-aqueous organic-based photoresist removal system may be realized, the photoresist pattern 135 and the polymer residues may be substantially only removed by the composition for removing photoresist, and the object layer 110, the substrate 100, and the impurity region 105 may not be damaged.

In some embodiments, the anti-reflective pattern 125 may be also removed by the composition for removing photoresist. In an embodiment, an ashing process and/or a strip process may be further performed to remove the anti-reflective pattern 125 and/or the hard mask pattern.

Figure 6:
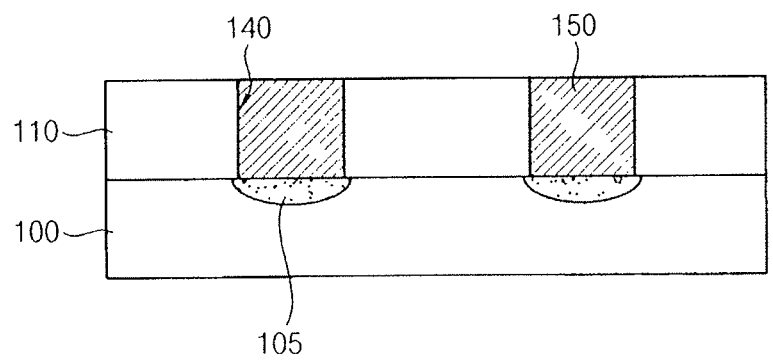

Referring to FIG. 6, a conductive pattern 150 may be formed in the opening 140. The conductive pattern 150 may be in contact with or electrically connected to the impurity region 105.

In example embodiments, a conductive layer sufficiently filling the opening 140 may be formed on the object layer 110. The conductive layer 110 may be formed of a metal such as copper, tungsten or aluminum, a metal nitride, or a metal silicide. An upper portion of the conductive layer may be planarized by, e.g., a chemical mechanical polish (CMP) process until a top surface of the object layer 110 may be exposed to form the conductive pattern 150.

The conductive pattern 150 may be a contact or a wiring electrically connected to the impurity region 105.

FIGS. 7 to 12 illustrate cross-sectional views of a method of manufacturing a semiconductor device in accordance with example embodiments. Detailed descriptions on process and/or materials substantially the same as or similar to those illustrated with reference to FIGS. 1 to 6 are omitted herein.

Figure 7:
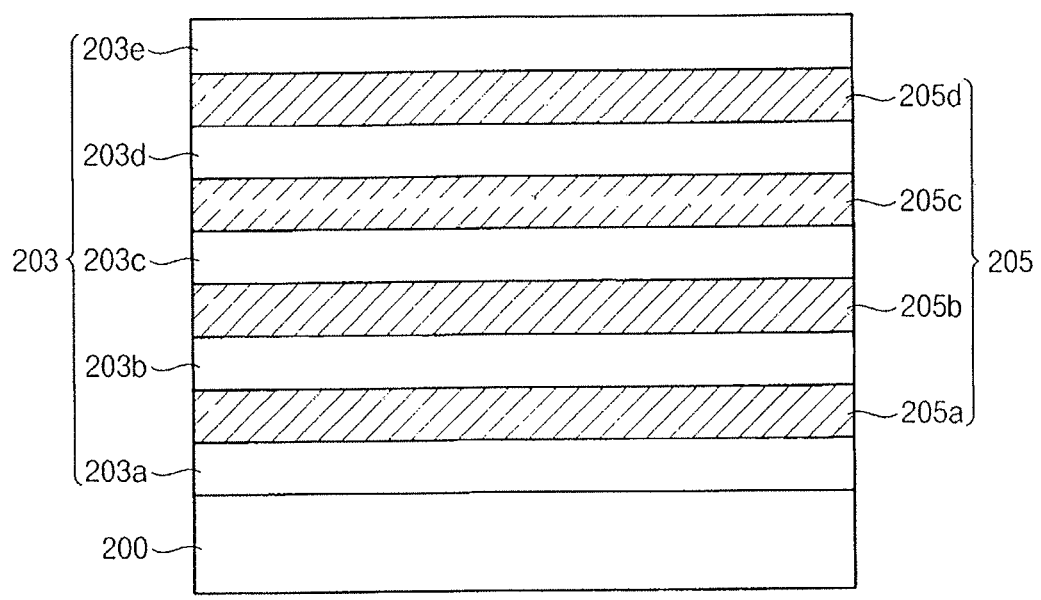
FIGS. 7 to 12 illustrate cross-sectional views of a method of manufacturing a semiconductor device in accordance with example embodiments.

Referring to FIG. 7, first layers 203 (e.g., 203a to 203e) and second layers 205 (e.g., 205a to 205d) may be formed repeatedly and alternately on a substrate 200.

The substrate 200 may include a semiconductor substrate such as a silicon substrate, a germanium substrate or a silicon-germanium substrate. An SOI substrate or a GOI substrate may be also used as the substrate 200. The substrate 200 may include a group III-V compound.

In example embodiments, the first layer 203 and the second layer 205 may include different inorganic material. In some embodiments, the first layer 203 may include silicon oxide, and the second layer 205 may include silicon nitride. A stacked layer structure may be formed on the substrate by alternately forming the first and second layers 203 and 205. The stacked number of the first and second layers 203 and 205 may be further increased. For example, the first layer 203 and the second layer 205 may be each formed at a single level, 2 levels, 3 levels, 5 levels or more.

The first layer 203 and the second layer 205 may be formed by, for example, a CVD process, a PECVD process, or an ALD process. A lowermost first layer 203a may be formed by a thermal oxidation process on the substrate 200.

Figure 8:
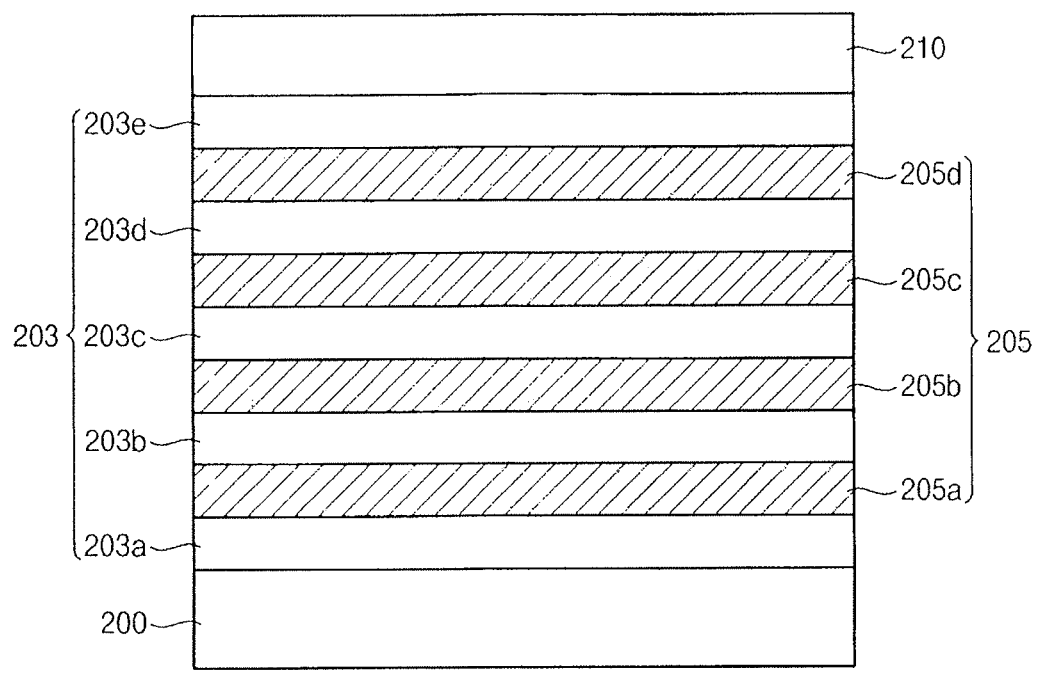

Referring to FIG. 8, as illustrated with reference to FIG. 1, a photoresist composition may be coated on, e.g., an uppermost first layer 203e to form a photoresist layer 210.

Figure 9:
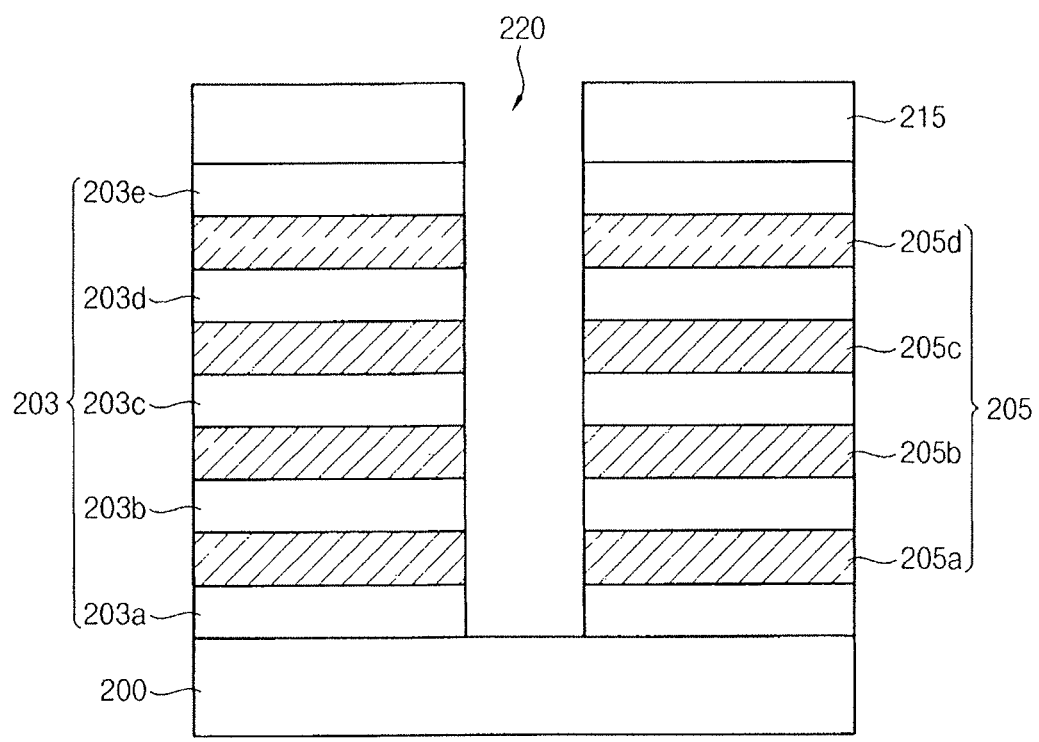

Referring to FIG. 9, the photoresist layer 210 may be partially removed to form a photoresist pattern 215, and the stacked layer structure may be partially etched to form an opening 220.

In example embodiments, the photoresist layer 210 may be partially removed by exposure and developing processes to form the photoresist pattern 215.

The stacked layer structure may be partially removed by a dry etching process using the photoresist pattern 215 as a mask pattern, and the opening 220 extending through the stacked layer structure in a vertical direction with respect to a top surface of the substrate 200 may be formed. In example embodiments, the opening 220 may expose the top surface of the substrate 200, and may also extend in a parallel direction with respect to the top surface of the substrate 200.

In some embodiments, an anti-reflective layer may be further formed on the uppermost first layer 203e before the formation of the photoresist layer 210. In an embodiment, a hard mask layer including, e.g., an SOH material may be further formed on the uppermost first layer 203e. The mask pattern may include a hard mask pattern, an anti-reflective pattern and the photoresist pattern 215 sequentially stacked on the uppermost first layer 203e.

In some example embodiments, after the formation of the opening 220, the second layers 205 may be replaced with conductive layers including a metal such as tungsten. For example, the second layers 205 exposed through the opening 220 may be removed using an acidic solution, e.g., phosphoric acid that may have an etching selectivity for silicon nitride. Subsequently, the conductive layer may be formed in spaces from which the second layers 205 may be removed.

In some embodiments, the conductive layer formed at each level may serve as a gate line. A vertical channel may be formed through the stacked layer structure, and may be connected with the substrate 200.

Figure 10:
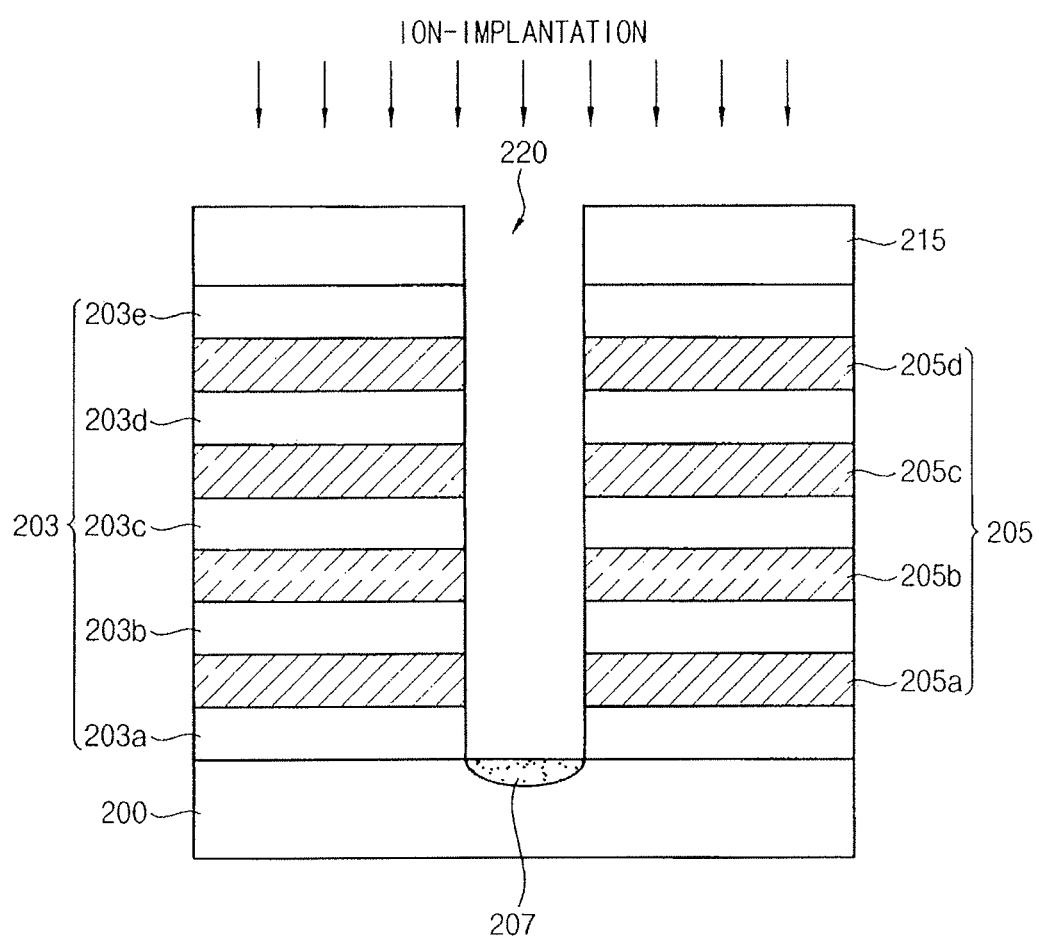

Referring to FIG. 10, a process substantially the same as or similar to that illustrated with reference to FIG. 4 may be performed to form an impurity region 207.

In example embodiments, the mask pattern including the photoresist pattern 215 may substantially serve as an ion-implantation mask. For example, the impurity region 207 may be formed at an upper portion of the substrate 200 exposed through the opening 220, and may extend in the parallel direction.

An upper portion of the photoresist pattern 215 may be cured by the ion-implantation process. Polymer residues may be generated from the photoresist pattern 215 to be attached to an inner wall of the opening 220.

Figure 11:
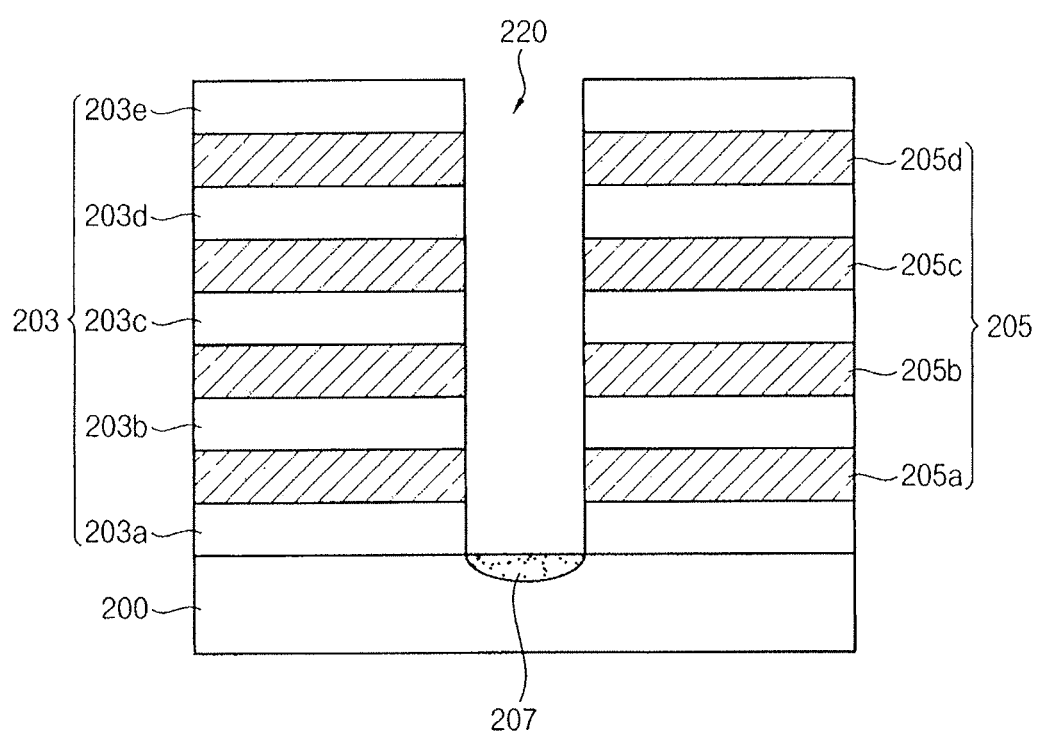

Referring to FIG. 11, the photoresist pattern 215 may be removed using the composition for removing photoresist in accordance with example embodiments.

As described above, the composition for removing photoresist may be used as a photoresist strip solution, and may include an alkyl ammonium fluoride salt, an organic sulfonic acid, and a lactone-based solvent. In some embodiments, the composition for removing photoresist may consist essentially of the alkyl ammonium fluoride salt, the organic sulfonic acid, and the lactone-based solvent.

In example embodiments, the composition for removing photoresist may include the alkyl ammonium fluoride salt in an amount ranging from about 0.5 wt % to about 10 wt %, the organic sulfonic acid in an amount ranging from about 1 wt % to about 20 wt %, and a remainder of the lactone-based solvent (e.g., in an amount ranging from about 70 wt % to about 98.5 wt %), based on a total weight of the composition.

In some embodiments, the composition for removing photoresist may include the alkyl ammonium fluoride salt in an amount ranging from about 1 wt % to about 8 or from about 1 wt % to about 6 wt %, the organic sulfonic acid in an amount ranging from about 1 wt % to about 10 wt %, and a remainder of the lactone-based solvent (e.g., in an amount ranging from about 80 wt % to about 98 wt %), based on the total weight of the composition.

In some embodiments, a compound represented as $FN((CH_2)_nCH_3)_4$ (n is an integer selected between 2 and 10) may be used as the alkyl ammonium fluoride salt. For example, tetra-butyl ammonium fluoride may be used as the alkyl ammonium fluoride salt.

In some embodiments, methane sulfonic acid, ethane sulfonic acid, 1-propane sulfonic acid, para-toluene sulfonic acid, and/or benzene sulfonic acid may be used as the organic sulfonic acid.

In some embodiments, gamma-butyrolactone, gamma-valerolactone, gamma-caprolactone, and/or gamma-heptalactone may be used as the lactone-based solvent.

In some embodiments, water and other organic acids such as formic acid or acetic acid may be excluded from the composition for removing photoresist. Accordingly, a substantially non-aqueous organic-based photoresist removal system may be realized, the photoresist pattern 215 and the polymer residues may be substantially only removed by the composition for removing photoresist, and the first layer 203, the second layer 205, the substrate 200, and the impurity region 207 may not be damaged.

According to example embodiments, the photoresist pattern 215 may be selectively removed using the composition for removing photoresist without damaging a lower structure formed on the substrate 200, even though different types of layers (e.g., the first and second layers 203 and 205) are exposed through the opening 220.

In some embodiments, the anti-reflective pattern and/or the hard mask pattern as mentioned above may be also removed by the composition for removing photoresist. In an embodiment, an ashing process and/or a strip process may be further performed to remove the anti-reflective pattern and/or the hard mask pattern.

Figure 12:
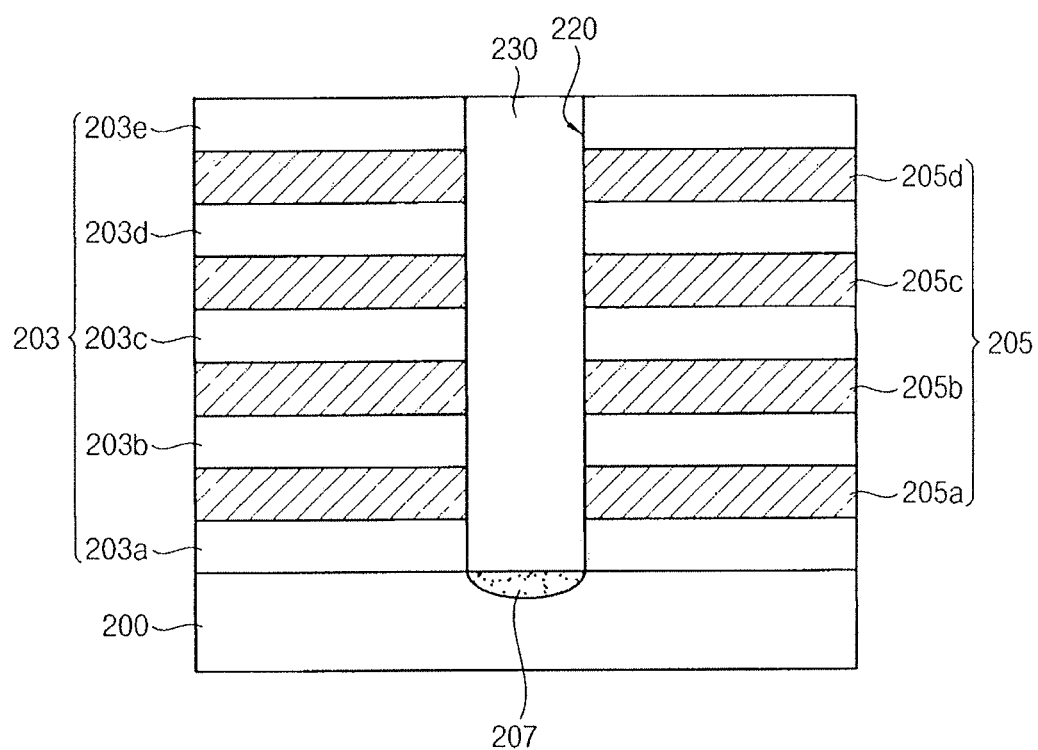

Referring to FIG. 12, a filling pattern 230 may be formed in the opening 220.

In example embodiments, a filling layer sufficiently filling the opening 220 may be formed on the uppermost first layer 203e. The filling layer may be formed of silicon oxide. For example, an upper portion of the filling layer may be planarized by a CMP process until the uppermost first layer 203e may be exposed to form the filling pattern 230.

In some embodiments, a contact electrically connected to the impurity region 207 may be further formed through the filling pattern 230.

FIGS. 13 to 22 illustrate cross-sectional views of a method of manufacturing a semiconductor device in accordance with example embodiments. Detailed descriptions on processes and/or materials substantially the same as or similar to those illustrated with reference to FIGS. 1 to 6, or FIGS. 7 to 12 are omitted herein.

Figure 13:
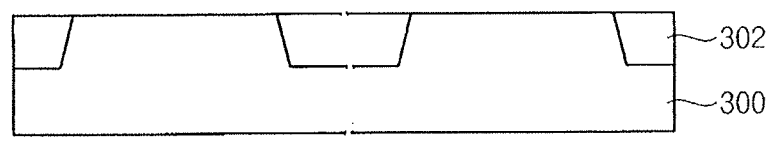
FIGS. 13 to 22 illustrate cross-sectional views of a method of manufacturing a semiconductor device in accordance with example embodiments.
Figure 13:

Referring to FIG. 13, a substrate 300 including a first region I and a second region II may be prepared.

In example embodiments, the first region I and the second region II may be provided as an N-channel metal oxide semiconductor (NMOS) region and a P-channel metal oxide semiconductor (PMOS) region, respectively. P-type impurities may be implanted at an upper portion of the first region I of the substrate 300 to form a p-type well. N-type impurities may be implanted at an upper portion of the second region II of the substrate 300 to form an n-type well. A shallow trench isolation (STI) process may be further performed to form an isolation layer 302. The substrate 300 may be divided into an active region and a field region by the isolation layer 302.

Figure 14:
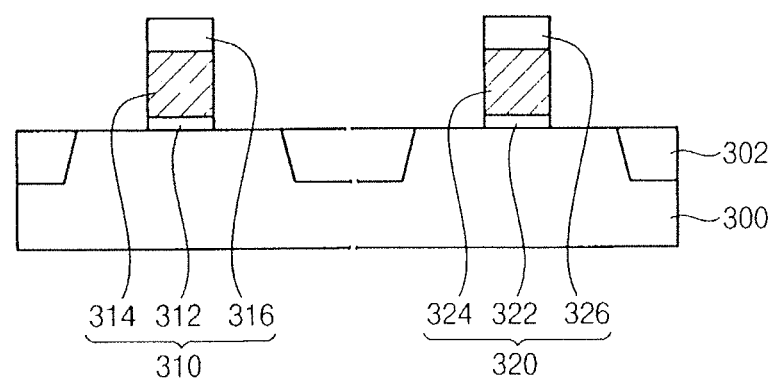
Figure 14:

Referring to FIG. 14, a first gate structure 310 and a second gate structure 320 may be formed on the first region I and the second region II, respectively, of the substrate 300.

The first gate structure 310 may include a first gate insulation pattern 312, a first gate electrode 314, and a first gate mask 316 sequentially stacked on the first region I of the substrate 300. The second gate structure 320 may include a second gate insulation pattern 322, a second gate electrode 324, and a second gate mask 326 sequentially stacked on the second region II of the substrate 300.

In example embodiments, a gate insulation layer, a gate electrode layer, and a gate mask layer may be sequentially formed on the substrate 300, and may be patterned by a photo-lithography process to form the first gate structure 310 and the second gate structure 320.

The gate insulation layer may be formed of silicon oxide or a metal oxide. In an embodiment, the gate insulation layer may be formed by a thermal oxidation process on the substrate 300. The gate electrode layer may be formed of doped polysilicon, a metal, a metal nitride, or a metal silicide. The gate mask layer may be formed of silicon nitride.

The gate insulation layer, the gate electrode layer and the gate mask layer may be formed by, for example, a CVD process, a PVD process, or an ALD process.

Figure 15:
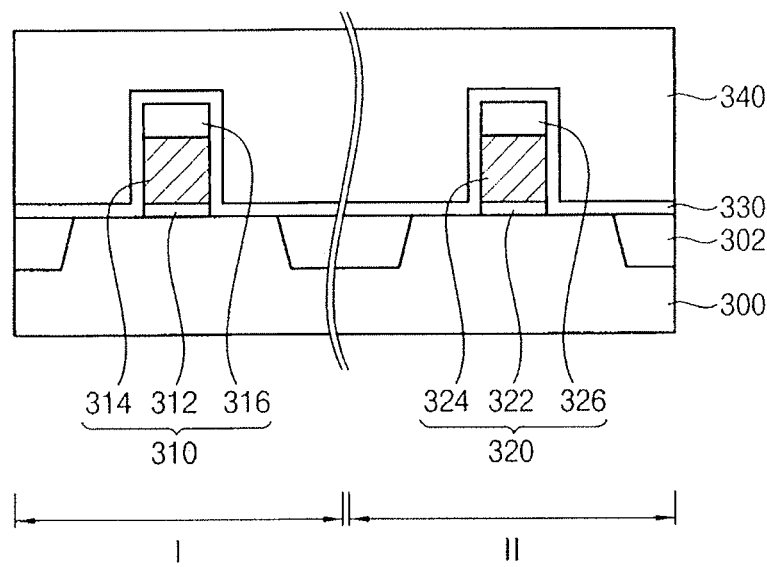

Referring to FIG. 15, an intermediate layer 330 and a first photoresist layer 340 covering the first and second gate structures 310 and 320 may be sequentially formed on the substrate 300.

The intermediate layer 330 may include, e.g., an anti-reflective layer. In an embodiment, the intermediate layer 330 may include a hard mask layer formed of an SOH material. In an embodiment, the intermediate layer 330 may serve as a passivation layer including, e.g., silicon nitride or silicon oxynitride.

In an embodiment, the formation of the intermediate layer 330 may be omitted.

The photoresist composition as mentioned above may be coated on the intermediate layer 330 or the substrate 300 to form the first photoresist layer 340.

Figure 16:
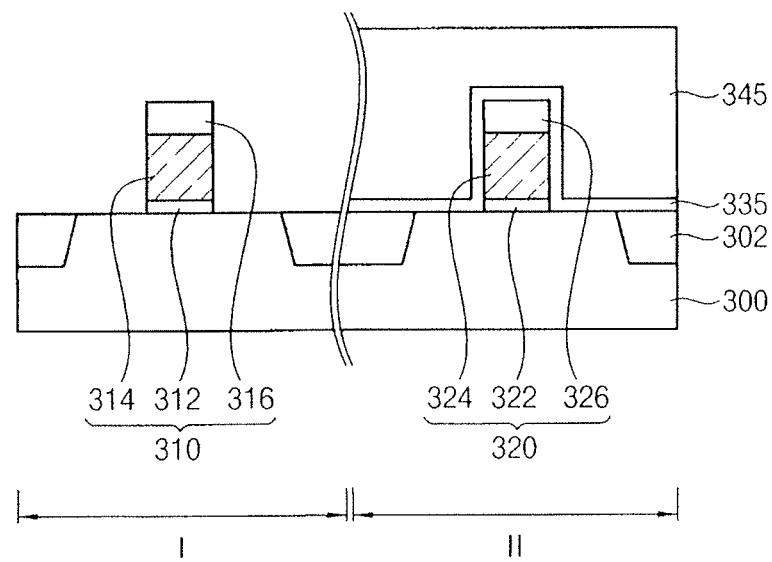

Referring to FIG. 16, a portion of the first photoresist layer 340 formed on the first region I may be removed. For example, an exposure process may be performed using an exposure mask through which the first region I may be exposed, and then the portion of the first photoresist layer 340 formed on the first region I may be removed by a developing process. Accordingly, a remaining portion of the first photoresist layer 340 on the second region II may be defined as a first photoresist pattern 345.

In some embodiments, a portion of the intermediate layer 330 formed on the first region I may be also removed to form an intermediate pattern 335 on the second region II. In some embodiments, an additional wet or dry etching process may be performed for the formation of the intermediate pattern 335. In some embodiments, the intermediate layer 330 may not be removed.

Figure 17:
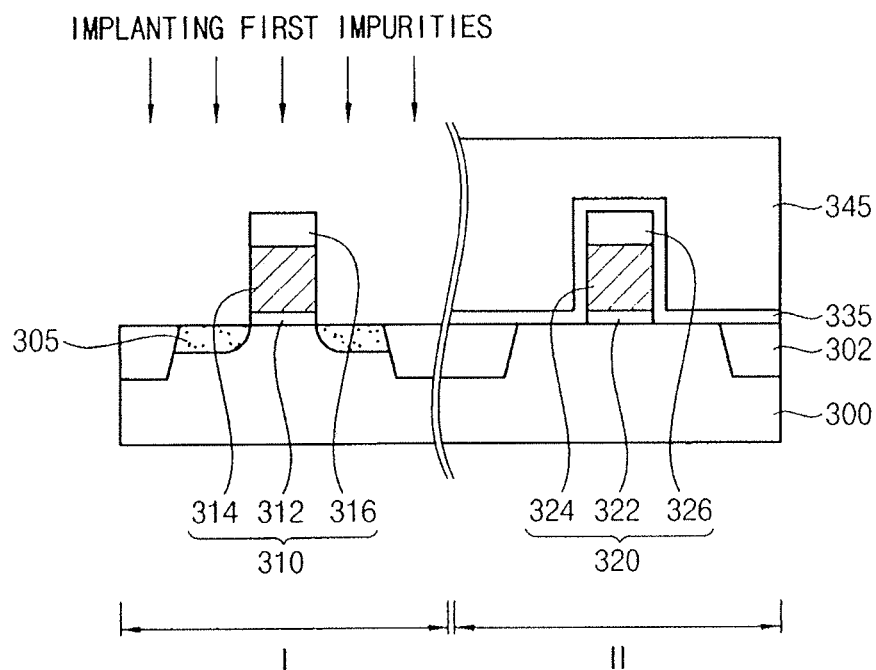

Referring to FIG. 17, first impurities may be implanted at an upper portion of the substrate 300 of the first region I by a first ion-implantation process, and a first impurity region 305 may be formed at the upper portion of the substrate 300 adjacent to the first gate structure 310. The first photoresist pattern 345 and the first gate structure 310 may substantially serve as an implantation mask in the first ion-implantation process. As described above, if the first region I is provided as the NMOS region, the first impurities may include n-type impurities such as phosphorous or arsenic.

Figure 18:
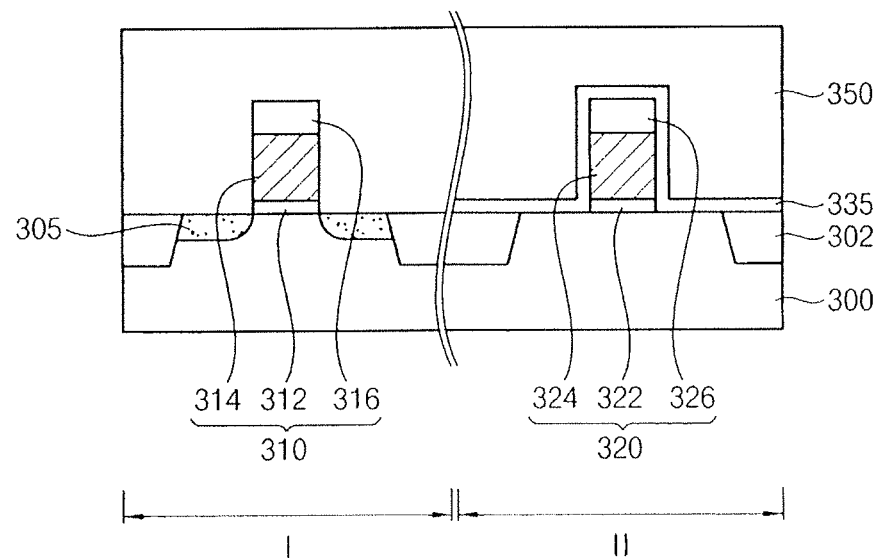

Referring to FIG. 18, the first photoresist pattern 345 may be removed, and a second photoresist layer 350 covering the first and second gate structures 310 and 320 may be formed on the substrate 300.

In example embodiments, the first photoresist pattern 345 may be removed using the composition for removing photoresist.

As described above, the composition for removing photoresist may be used as a photoresist strip solution, and may include an alkyl ammonium fluoride salt, an organic sulfonic acid, and a lactone-based solvent. In some embodiments, the composition for removing photoresist may consist essentially of the alkyl ammonium fluoride salt, the organic sulfonic acid, and the lactone-based solvent.

In example embodiments, the composition for removing photoresist may include the alkyl ammonium fluoride salt in an amount ranging from about 0.5 wt % to about 10 wt %, the organic sulfonic acid in an amount ranging from about 1 wt % to about 20 wt %, and a remainder of the lactone-based solvent (e.g., in an amount ranging from about 70 wt % to about 98.5 wt %), based on a total weight of the composition.

In some embodiments, the composition for removing photoresist may include the alkyl ammonium fluoride salt in an amount ranging from about 1 wt % to about 8 wt % or from about 1 wt % to about 6 wt %, the organic sulfonic acid in an amount ranging from about 1 wt % to about 10 wt %, and a remainder of the lactone-based solvent (e.g., in an amount ranging from about 80 wt % to about 98 wt %), based on the total weight of the composition.

In some embodiments, a compound represented as $FN((CH_2)_nCH_3)_4$ (n is an integer selected between 2 and 10) may be used as the alkyl ammonium fluoride salt. For example, tetra-butyl ammonium fluoride may be used as the alkyl ammonium fluoride salt.

In some embodiments, methane sulfonic acid, ethane sulfonic acid, I-propane sulfonic acid, para-toluene sulfonic acid, and/or benzene sulfonic acid may be used as the organic sulfonic acid.

In some embodiments, gamma-butyrolactone, gamma-valerolactone, gamma-caprolactone, and/or gamma-heptalactone may be used as the lactone-based solvent.

In some embodiments, water and other organic acids such as formic acid or acetic acid may be excluded from the composition for removing photoresist. Accordingly, a substantially non-aqueous organic-based photoresist removal system having a high selectivity for a photoresist material may be realized, the photoresist pattern 345 and polymer residues may be substantially only removed by the composition for removing photoresist, and the first gate mask 316, the first gate electrode 314, the first gate insulation pattern 312, and the substrate 300, which may include different materials, may not be damaged.

In some embodiments, the intermediate pattern 335 may remain on the substrate 300.

After the removal of the first photoresist pattern 345, the second photoresist layer 350 covering the first and second gate structures 310 and 320 may be formed from a material and a process substantially the same as or similar to those for the first photoresist layer 340.

Figure 19:
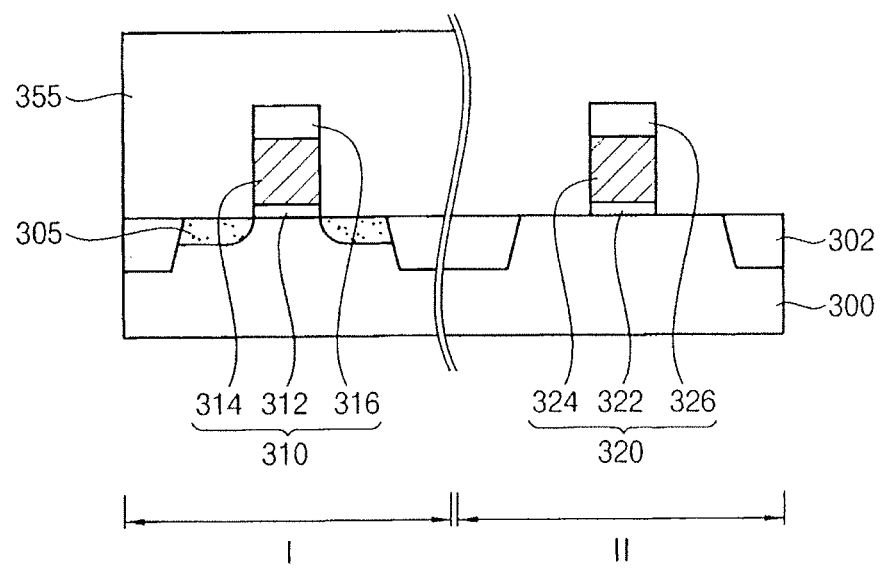

Referring to FIG. 19, a process substantially the same as or similar to that illustrated with reference to FIG. 16 may be performed on the second region II of the substrate 300.

A portion of the second photoresist layer 350 formed on the second region II, and the intermediate pattern 335 may be removed. In some embodiments, the intermediate pattern 335 may not be removed.

A portion of the second photoresist layer 350 remaining on the first region I may be defined as a second photoresist pattern 355.

Figure 20:
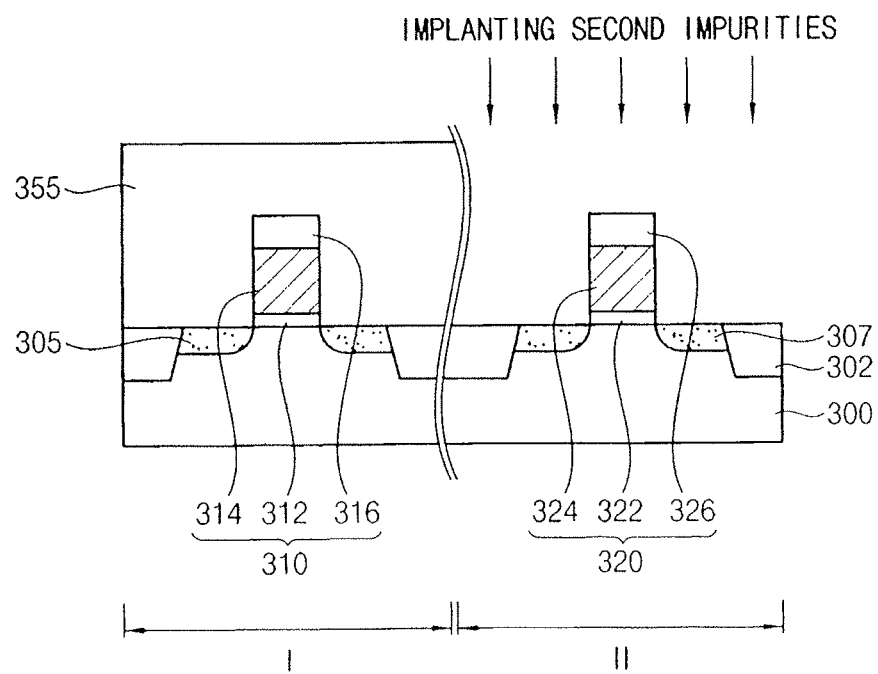

Referring to FIG. 20, second impurities may be implanted at an upper portion of the substrate 300 of the second region II by a second ion-implantation process, and a second impurity region 307 may be formed at the upper portion of the substrate 300 adjacent to the second gate structure 320. The second photoresist pattern 355 and the second gate structure 320 may substantially serve as an implantation mask in the second ion-implantation process.

As described above, if the second region II is provided as the PMOS region, the second impurities may include p-type impurities such as boron.

Figure 21:
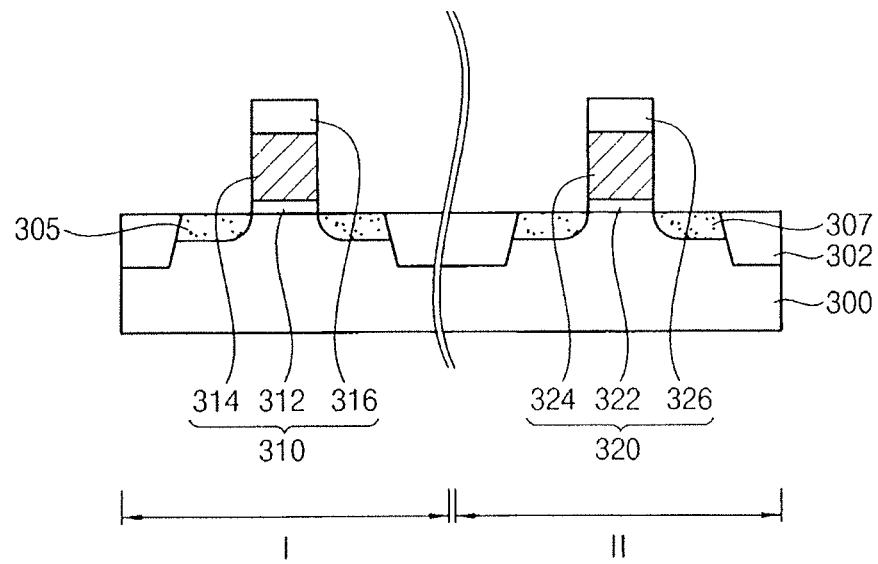

Referring to FIG. 21, as described with reference to FIG. 18, the second photoresist pattern 355 may be removed using the composition for removing photoresist in accordance with example embodiments.

As described above, a substantially organic-based hydrophobic photoresist removal system may be realized from the composition for removing photoresist. Therefore, the second photoresist pattern 355 and polymer residues may be substantially only removed by the composition for removing photoresist, and the second gate mask 326, the second gate electrode 324, the second gate insulation pattern 322, and the substrate 300 may not be damaged.

Figure 22:
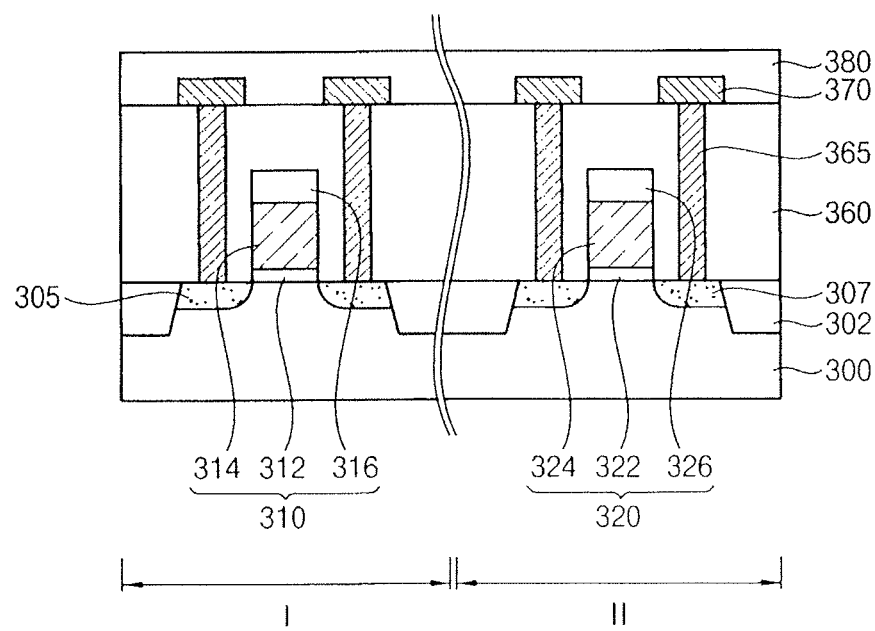

Referring to FIG. 22, wiring structures may be further formed to obtain the semiconductor device in accordance with example embodiments.

In example embodiments, a first insulating interlayer 360 covering the first and second gate structures 310 and 320 may be formed on the substrate 300. Plugs 365 electrically connected to the first and second impurity regions 305 and 307 may be formed through the first insulating interlayer 360. In example embodiments, the first insulating interlayer 360 may be partially etched to form contact holes through which the first and second impurity regions 305 and 307 are exposed. A first conductive layer sufficiently filling the contact holes may be formed on the first insulating interlayer 360, and the exposed first and second impurity regions 305 and 307. An upper portion of the first conductive layer may be planarized by, e.g., a CMP process to form the plugs 365.

A second conductive layer may be formed on the first insulating interlayer 360, and then may be patterned to form wirings 370 electrically connected to the plugs 365. A second insulating interlayer 380 covering the wirings 370 may be formed on the first insulating interlayer 360.

For example, the first and second insulating interlayers 360 and 380 may be formed of silicon oxide by, for example, a CVD process, a PECVD process, or an ALD process. The first and second conductive layers may be formed of a metal or a metal nitride such as titanium, titanium nitride, tungsten, tungsten nitride, or aluminum by, for example, a sputtering process, a PVD process, or an ALD process.

A circuit structure including, for example, a pad and/or a memory unit, may be further formed to be electrically connected to the wirings 370.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparing Compositions for Removing Photoresist

Compositions for removing photoresist were prepared by using components (abbreviated as "Com" in Table 1) and amounts provided in Table 1, below. The amounts in Table 1 refer to weight percent (wt %) based on a total weight of each composition.

TABLE 1

| | Organic Acid | | Alkyl Ammonium Fluoride Salt | | Ammonium Fluoride Salt | | Lactone-based Solvent | | Deionized Water |
|---|---|---|---|---|---|---|---|---|---|
| | Com | wt % | Com | wt % | Com | wt % | Com | wt % | |
| Example 1 | A-1 | 5 | B-1 | 4 | — | — | D-1 | 91 | — |
| Example 2 | A-1 | 5 | B-1 | 4 | — | — | D-2 | 91 | — |
| Example 3 | A-1 | 5 | B-1 | 4 | — | — | D-3 | 91 | — |

TABLE 1-continued

| | Organic Acid | | Alkyl Ammonium Fluoride Salt | | Ammonium Fluoride Salt | | Lactone-based Solvent | | Deionized Water |
|---|---|---|---|---|---|---|---|---|---|
| | Com | wt % | Com | wt % | Com | wt % | Com | wt % | |
| Example 4 | A-1 | 10 | B-1 | 6 | — | — | D-1 | 84 | — |
| Example 5 | A-2 | 5 | B-1 | 4 | — | — | D-1 | 91 | — |
| Example 6 | A-1 | 5 | B-2 | 4 | — | — | D-1 | 91 | — |
| Example 7 | A-1 | 5 | B-1 | 0.5 | — | — | D-1 | 94.5 | — |
| Example 8 | A-1 | 5 | B-1 | 10 | — | — | D-1 | 85 | — |
| Example 9 | A-1 | 1 | B-1 | 4 | — | — | D-1 | 95 | — |
| Example 10 | A-1 | 20 | B-1 | 4 | — | — | D-1 | 76 | — |
| Example 11 | A-1 | 1 | B-1 | 0.5 | — | — | D-1 | 98.5 | — |
| Example 12 | A-1 | 20 | B-1 | 10 | — | — | D-1 | 70 | — |
| Comparative Example 1 | A-3 | 5 | B-1 | 4 | — | — | D-1 | 91 | — |
| Comparative Example 2 | A-4 | 5 | B-1 | 4 | — | — | D-1 | 91 | — |
| Comparative Example 3 | A-1 | 5 | — | — | C-1 | 1 | D-1 | 94 | — |
| Comparative Example 4 | A-1 | 5 | — | — | C-2 | 1 | D-1 | 94 | — |
| Comparative Example 5 | A-1 | 5 | — | — | C-1 | 1 | D-1 | 84 | 10 |
| Comparative Example 6 | A-1 | 5 | B-1 | 4 | — | — | D-1 | 81 | 10 |
| Comparative Example 7 | A-1 | 5 | B-1 | 0.1 | — | — | D-1 | 94.9 | — |
| Comparative Example 8 | A-1 | 5 | B-1 | 15 | — | — | D-1 | 80 | — |
| Comparative Example 9 | A-1 | 0.5 | B-1 | 4 | — | — | D-1 | 95.5 | — |
| Comparative Example 10 | A-1 | 25 | B-1 | 4 | — | — | D-1 | 71 | — |
| Comparative Example 11 | A-1 | 5 | B-1 | 4 | — | — | D-4 | 91 | — |
| Comparative Example 12 | A-1 | 5 | B-1 | 4 | — | — | D-5 | 91 | — |

The components used in the composition for removing photoresist are provided in Table 2, below.

TABLE 2

| | Descriptions of Components |
|---|---|
| A-1 | methane sulfonic acid |
| A-2 | para-toluene sulfonic acid |
| A-3 | formic acid |
| A-4 | acetic acid |
| B-1 | tetra-butyl ammonium fluoride |
| B-2 | tetra-methyl ammonium fluoride |
| C-1 | ammonium fluoride |
| C-2 | ammonium bifluoride |
| D-1 | gamma-butyrolactone |
| D-2 | gamma-valerolactone |
| D-3 | gamma-caprolactone |
| D-4 | propylene glycol methyl ether acetic acid |
| D-5 | cyclohexane |

Experimental Example 1: Evaluations on Removal of Photoresists and Damages of Germanium (Ge)

A germanium layer was formed on a silicon wafer to prepare a substrate, and a novolac-based photoresist material was coated on the germanium layer to form a photoresist layer. Exposure and developing processes were performed to form a photoresist pattern including a hole, and boron (B) was implanted through the hole on the germanium layer. Samples having a dimension of 2 cm×2 cm were prepared from the ion-implanted substrate. The samples were immersed in the compositions of Examples and Comparative Examples provided in Table 1 at a temperature of 60° C. for 2 minutes. The samples were washed with water, and then monitored by a scanning electron microscope (SEM, Hitachi S-4700) to evaluate a removal of the photoresist pattern that was modified by the ion-implantation. Additionally, the samples were immersed in the compositions of Examples and Comparative Examples provided in Table 1 at a temperature of 60° C. for 10 minutes, and then etching rates (Å/min) with respect to the germanium layer were measured to evaluate a damage of the germanium layer. The results are shown in Table 3, below.

Symbols representing the removal of photoresist are provided as follows:

1) ⊚: At least 95% of the photoresist pattern was removed.
2) ○: At least 90% of the photoresist pattern was removed.
3) Δ: At least 80% of the photoresist pattern was removed.
4) X: Less than 70% of the photoresist pattern was removed.

Experimental Example 2: Evaluations on Solubility of Compositions

Generation of precipitates was visually observed in each composition while measuring the removal of photoresist in Experimental Example 1 to evaluate a solubility of the composition. The results are also shown in Table 3, below.

Symbols representing the solubility are provided as follows:

1) ○: Precipitates were not generated and the composition was transparent.

2) Δ: Precipitates were not generated, however, the composition became suspended.

3) X: Precipitates and suspension were generated in the composition.

TABLE 3

|  | Removal of Photoresist | Damage of Ge (Å/min) | Solubility |
| --- | --- | --- | --- |
| Example 1 | ⊚ | <1 | ○ |
| Example 2 | ⊚ | <1 | ○ |
| Example 3 | ⊚ | <1 | ○ |
| Example 4 | ⊚ | <1 | ○ |
| Example 5 | ○ | 2.0 | ○ |
| Example 6 | ○ | 1.2 | ○ |
| Example 7 | ○ | <1 | ○ |
| Example 8 | ⊚ | 3.3 | ○ |
| Example 9 | ○ | <1 | ○ |
| Example 10 | ⊚ | 3.6 | ○ |
| Example 11 | ○ | <1 | ○ |
| Example 12 | ⊚ | 4.7 | ○ |
| Comparative Example 1 | ○ | 23.5 | ○ |
| Comparative Example 2 | ○ | 21.0 | ○ |
| Comparative Example 3 | — | — | X |
| Comparative Example 4 | — | — | X |
| Comparative Example 5 | ⊚ | 33.2 | ○ |
| Comparative Example 6 | ⊚ | 15.8 | ○ |
| Comparative Example 7 | Δ | <1 | ○ |
| Comparative Example 8 | ⊚ | 9.1 | Δ |
| Comparative Example 9 | Δ | <1 | ○ |
| Comparative Example 10 | ⊚ | 10.0 | ○ |
| Comparative Example 11 | Δ | <1 | ○ |
| Comparative Example 12 | — | — | X |

Referring to Table 3 above, when the compositions of Examples were used, the etching rates of the germanium layer were controlled below about 5, and the improved removal of photoresist and solubility were achieved. In the compositions of Examples 1 to 3 in which tetra-butyl ammonium fluoride of about 4 wt % was used as the alkyl ammonium fluoride salt, methane sulfonic acid of about 5 wt % was used as the organic sulfonic acid, and a remainder of the lactone-based solvent was used, the etching rates of the germanium layer were controlled below about 1, and the improved removal of photoresist and solubility were achieved.

In the compositions of Comparative Examples 1 and 2 in which formic acid and acetic acid were used, respectively, instead of the organic sulfonic acid, the etching rates of the germanium layer were excessively increased. Thus, the compositions of Comparative Examples 1 and 2 were not suitable for being used as a photoresist stripping solution.

In the compositions of Comparative Examples 3 and 4 in which inorganic ammonium fluorides were used instead of the alkyl ammonium fluoride salt, the components therein were not substantially dissolved in the organic solvent so that the compositions were not able to be utilized as the photoresist stripping solution. In the compositions of Comparative Examples 5 and 6 in which deionized water was used together with the organic solvent, the etching rates of the germanium layer were drastically increased.

By way of summation and review, an ion-implantation process may be performed to form an impurity region in a semiconductor device fabrication. For example, a photoresist layer may be formed on a substrate, and the photoresist layer may be partially removed by developing and exposure processes to form a photoresist pattern through which a predetermined region of the substrate may be exposed. The ion-implantation process may be performed using the photoresist pattern as an implantation mask to form the impurity region at the predetermined region of the substrate. Subsequently, the photoresist pattern may be removed by an ashing process and/or a strip process for a next device process. However, the photoresist pattern may be cured by an ion-injection, and the photoresist pattern may not be easily removed by, e.g., a stripper solution. While removing the photoresist pattern, an organic residue may be generated, and a lower layer including, e.g., the substrate, an oxide layer, a nitride layer, or a metal layer may be damaged by the stripper solution.

According to example embodiments, a composition for removing photoresist may include an alkyl ammonium fluoride salt, an organic sulfonic acid and an organic solvent, and may be substantially devoid of water. An organic-based composition devoid of water may be used, and a polymer residue from a photoresist may be easily dissolved. Damages of, e.g., damage to, a lower structure such as a substrate, an insulation layer, and a conductive layer except for, e.g., other than, the photoresist may be minimized. Tetra-butyl ammonium fluoride, methane sulfonic acid, and a lactone-based solvent may be used as the alkyl ammonium fluoride salt, the organic sulfonic acid, and the organic solvent, respectively.

Example embodiments relate to compositions for removing photoresist including organic components and methods of manufacturing semiconductor devices using the same. Example embodiments may provide a composition for removing photoresist having improved reliability. Example embodiments may provide a method of manufacturing a semiconductor device using the composition.

According to example embodiments, the composition for removing photoresist may include an alkyl ammonium fluoride salt, an organic sulfonic acid, and a lactone-based solvent. The composition for removing photoresist may be substantially devoid of water, and polymer residues from a photoresist pattern may be substantially fully dissolved using an organic-based system. The photoresist pattern may be selectively removed by the composition without damaging a semiconductor substrate and a lower structure formed thereon including, for example, a metal, an oxide, or a nitride.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for removing photoresist, the composition comprising:
   an alkyl ammonium fluoride salt in an amount ranging from about 0.5 weight percent to about 10 weight percent, based on a total weight of the composition;
   an organic sulfonic acid in an amount ranging from about 1 weight percent to about 20 weight percent, based on the total weight of the composition; and
   a lactone-based solvent in an amount ranging from about 70 weight percent to about 98.5 weight percent, based on the total weight of the composition, wherein:

the alkyl ammonium fluoride salt is represented by the following Chemical Formula:

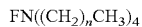 [Chemical Formula 5]

in the Chemical Formula, n is an integer between 2 and 10, the organic sulfonic acid includes one or more of methane sulfonic acid, ethane sulfonic acid, I-propane sulfonic acid, para-toluene sulfonic acid, or benzene sulfonic acid, and the composition is devoid of water.

2. The composition as claimed in claim 1, wherein:

the alkyl ammonium fluoride salt is in an amount ranging from about 1 weight percent to about 6 weight percent, based on the total weight of the composition;

the organic sulfonic acid is in an amount ranging from about 1 weight percent to about 10 weight percent, based on the total weight of the composition; and the lactone-based solvent is in an amount ranging from about 80 weight percent to about 98 weight percent, based on the total weight of the composition.

3. The composition as claimed in claim 1, wherein the alkyl ammonium fluoride salt consists essentially of tetra-butyl ammonium fluoride.

4. The composition as claimed in claim 1, wherein the organic sulfonic acid consists essentially of methane sulfonic acid.

5. The composition as claimed in claim 1, wherein the lactone-based solvent includes one or more of gamma-butyrolactone, gamma-valerolactone, gamma-caprolactone, or gamma-heptalactone.

6. The composition as claimed in claim 5, wherein the lactone-based solvent includes gamma-butyrolactone.

7. The composition as claimed in claim 1, wherein the composition for removing photoresist is also devoid of other acidic components except for the organic sulfonic acid.

* * * * *